US012801039B2

(12) United States Patent
Toepfer

(10) Patent No.: US 12,801,039 B2
(45) Date of Patent: Nov. 17, 2026

(54) METHOD FOR DETERMINING A LOCATION OF AN OBJECT SURFACE

(71) Applicant: Carl Zeiss SMT GmbH, Oberkochen (DE)

(72) Inventor: Susanne Toepfer, Gleina-Baumersroda (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 131 days.

(21) Appl. No.: 18/775,344

(22) Filed: Jul. 17, 2024

(65) Prior Publication Data

US 2025/0036034 A1 Jan. 30, 2025

(30) Foreign Application Priority Data

Jul. 25, 2023 (DE) ......................... 102023119683.9

(51) Int. Cl.

*G03F 7/20* (2006.01)
*G02B 7/36* (2021.01)
*G03F 9/00* (2006.01)

(52) U.S. Cl.

CPC ............. *G03F 9/7026* (2013.01); *G02B 7/36* (2013.01)

(58) Field of Classification Search

CPC ........... G03F 9/7026; G03F 1/84; G02B 7/36; G02B 21/361; G01B 11/03; G01B 2210/56

See application file for complete search history.

(56) References Cited

U.S. PATENT DOCUMENTS

| | | | |
|---|---|---|---|
| 5,448,332 | A | 9/1995 | Sakakibara et al. |
| 5,461,237 | A | 10/1995 | Wakamoto et al. |
| 5,502,311 | A | 3/1996 | Imai et al. |
| 2004/0146295 | A1 | 7/2004 | Furman et al. |
| 2005/0174584 | A1 | 8/2005 | Chalmers et al. |
| 2011/0134308 | A1 | 6/2011 | Arnz et al. |
| 2020/0334446 | A1 | 10/2020 | Fang |
| 2020/0412939 | A1 | 12/2020 | Laengle |
| 2021/0018850 | A1 | 1/2021 | Slachter et al. |
| 2022/0057598 | A1 | 2/2022 | Seidel |

FOREIGN PATENT DOCUMENTS

| | | | |
|---|---|---|---|
| DE | 102008005356 | 7/2009 | G02B 21/24 |
| DE | 102019112156 | 9/2020 | G03F 9/02 |
| DE | 102019117293 | 11/2020 | G03F 9/02 |
| TW | I310457 | 6/2009 | G01N 21/88 |
| TW | 202107211 | 2/2021 | G03F 7/20 |
| TW | 202215475 | 4/2022 | H01J 37/252 |
| TW | I794612 | 3/2023 | G03F 9/00 |

OTHER PUBLICATIONS

The Search Report issued by the Taiwan Patent Office for Application No. TW 113127614 dated Jun. 2, 2025.
The Office Action issued by the German Patent Office for Application No. DE 10 2023 119 683.9, dated Mar. 5, 2024 (With English Translation).
Office Action in Korean Appln. No. 10-2024-0098397, mailed on Aug. 14, 2026, 14 pages (with English machine translation).

*Primary Examiner* — Mesfin T Asfaw
(74) *Attorney, Agent, or Firm* — Fish & Richardson P.C.

(57) ABSTRACT

Disclosed is a method for determining a location of an object surface (16) in relation to a target location in a measuring device for semiconductor technology, the location being determined on the basis of at least two measured values which represent the location, wherein the determination of the location comprises a probability analysis.

22 Claims, 4 Drawing Sheets

METHOD FOR DETERMINING A LOCATION OF AN OBJECT SURFACE

CROSS REFERENCE TO RELATED APPLICATIONS

The present application claims priority from German patent application DE 10 2023 119 683.9, filed on Jul. 25, 2023, the content of which is fully incorporated herein by reference.

TECHNICAL FIELD

This disclosure relates to a method for determining a location of an object surface, in particular of semiconductor lithography substrates such as photolithographic masks and wafers.

BACKGROUND

Photolithographic masks and wafers are used in lithography systems or for producing microstructured components, such as integrated circuits or LCDs (liquid crystal displays). In a lithography process or a microlithography process, an illumination unit illuminates a photolithographic mask, which is also referred to as photomask or simply mask. A projection optical unit is used to project the light passing through the mask, or the light reflected by the mask, onto a wafer coated with a light-sensitive layer (photoresist) and arranged in the image plane of the projection optical unit, in order to transfer the structure elements of the mask to the light-sensitive coating of the wafer and thereby create a desired structure on the wafer.

The structure elements must be positioned very accurately on the surface of masks so that the permissible deviations from the predetermined positions thereof or deviations from a critical dimension (CD) of a structure element are in the nanometre range, preferably in the sub-nanometre range, so as not to lead to errors on wafers during the exposure with the corresponding mask. The production of photomasks which can meet these requirements is extremely complex, susceptible to errors and hence expensive. Thus, damaged masks or masks with deviations from the desired specifications must be repaired whenever possible.

An important precondition for repairing defective masks is the finding and characterization of defects which are present, in particular of positioning defects or positioning errors. The detection of positioning defects and/or deviations from critical dimensions is complicated and difficult as these dimensions need to be established with an accuracy in the single-digit nanometre range, preferably in the sub-nanometre range.

Measuring devices, for example mask inspection microscopes, are used for the examination of positioning errors and/or the critical dimensions. An image of the mask structures that is as sharp as possible is a precondition for an accurate determination of positioning effects and/or deviations of the critical dimensions. This requires the surface of the mask to be positioned as accurately as possible in what is known as the focal plane of the imaging optical unit of the measuring device.

The focal plane is the place at which a flat object, for example the mask surface, must be positioned in order to be recorded in a recording device with maximum sharpness. In a z-direction that runs perpendicular to the mask surface, the location of this focal plane depends on the distance between the recording device and an imaging optical unit of the mask inspection microscope, and on the optical properties of the imaging optical unit. Thus, its location is defined by the configuration of the mask inspection microscope.

Despite being called focal plane, the focus of the imaging optical unit is not situated in said focal plane. Using terminology from geometrical optics, the focal plane in fact is a plane at the object distance which is assigned to a fixed image distance (determined by the properties and configuration of the imaging optical unit and the recording device). In this case, the maximum permissible deviation from the focal plane (target location) allowing capture of a sharp image of the mask surface is determined by the depth of focus (usually a few hundred nm) of the imaging optical unit. It is advantageous here to position an object to be examined in the region of the focal plane with an accuracy of down to a few nm where possible.

The deviation of the position of a mask surface from the focal plane is determined within the scope of autofocusing, i.e. after a calibration of the mask inspection microscope and the determination of the thickness of the mask to be measured, and before the actual measurement of the mask, such as the determination of the precise location or geometry of a structure arranged on the mask. Autofocusing is intended to ensure that for the structure measurement the mask surface is positioned in the aforementioned region of the depth of focus, or ideally in the focal plane, of the imaging optical unit.

Following the calibration of the measuring device and the measurement of the thickness of the mask, the latter is positioned such that the mask surface is located in the region of the focal plane. In this case, positioning is sufficiently accurate that, with the aid of so-called autofocus systems, the remaining deviation of the mask surface from the focal plane can be determined, and the mask can be positioned for a subsequent measurement.

The autofocus systems determine the deviation by evaluating an image of a measurement structure projected onto the mask surface. The image is recorded by a recording device, for example a CCD camera, which subsequently also serves to record the structures of the mask. In this context, the measurement structure is projected onto the mask surface such that, independently of the deviation of the mask surface from the focal plane and over a predetermined capture region of the imaging optical unit, a portion of the measurement structure is imaged sharply on the recording device via the imaging optical unit of the position measuring device.

The distance in pixels, as determined from the image, between the position of the highest image sharpness in the projection of the measurement structure and a centre line of the measurement structure, which is usually defined centrally in the measurement structure and calibrated in advance, corresponds to the distance in nm, following a conversion using a known factor, between the mask surface and the focal plane of the imaging optical unit.

To improve the measurement accuracy and avoid measurement errors on account of an interaction between the projected measurement structure and the structures formed on the mask, the measurement structure comprises at least two, in particular three, gratings with different periodicities. The deviation of the location of the greatest image sharpness from the centre line is determined independently of one another for all gratings. According to the prior art, the assumed deviation of the mask surface from the focal plane is determined from the thus determined deviations by way of a simple averaging of the measured deviations.

SUMMARY

The present inventors have recognized that this prior art method is linked to the disadvantage that an incorrect determination of a deviation of one of the gratings can already falsify the assumed deviation significantly, and this may consequently lead to an error when determining the positioning error and/or the critical dimensions of the structures. It is an object of the present disclosure to specify a method which eliminates the above-described disadvantages of the prior art.

Accordingly, in one aspect, disclosed is a method for determining a location of an object surface in relation to a target location in a measuring device for semiconductor technology, wherein the location is determined on the basis of at least two measured values which represent the location. The method is distinguished by the determination of the location comprising a probability analysis. In this case, the target location may correspond to, for example, the z-location of a focal plane of a measuring device designed as a mask inspection microscope.

The probability analysis brings about weighting of the measured values used for the determination of the location, and so incorrect measurements of individual measured values receive a lower weighting than correct measurements. In particular, the decision to not use individual values, i.e. provide these with a weighting of zero, can be made on the basis of the probability analysis.

This is linked to the advantage that, following the determination of the location, the object surface can be positioned in its target location with greater accuracy and after fewer required measurements, and the subsequent measurement of the surface, for example the determination of the structure dimensions, can attain a greater accuracy, and possible repetitions of the measurements on account of excessively large deviations from the target location can be avoided, i.e. a higher throughput can be obtained.

For sub-combinations of at least three measured values, a mean value of the respective sub-combination can be determined in each case as a combination result in an advantageous embodiment. As mentioned previously, the measured values can be pixel values, for example the number of a pixel row or column on a CCD chip, for which the highest image sharpness is established in the image of a grating.

In particular, probability functions can be defined for the at least three measured values, and a probability can be determined in each case for possible combination results of the three measured values. Advantageously, Gaussian functions can be used as probability functions in this case.

The combination results are based on the assumption that it is initially unclear how many of e.g. three measured values (in the case of three utilized gratings) are correct. For example, only one measured value might be correct, or else two or all three measured values.

For three gratings, this assumption leads to seven combination results, corresponding to the three individual measured values (assumption: only one measured value is correct), three mean values of in each case two measured values (assumption: two measured values are correct in each case) and a mean value of all three measured values (assumption: all three measured values are correct).

The individual combination results advantageously represent mean values of the measured values assumed to be correct in each case or the measured value used in each case (should only one measured value be assumed to be correct).

To determine the probability of the respective combination result, the values of the probability functions of the individually used measured values can then be added for the respective combination result. In a variant of the method, a decision regarding the combination result to be utilized and hence the most probable location of the object surface can already be made on the basis of this evaluation, by virtue of using the combination result for which the addition supplies the highest value. This result then represents the most probable location of the object surface in the z-direction.

The method can be improved, in particular, by virtue of a probability function for metrological expectations being included in the probability analysis. The latter is based on already determined deviations and the empirical knowledge regarding the distribution of the values of typical deviations connected therewith, on the basis of which a probability function is determined for the position of the mask surface prior to autofocusing. Thus, the associated probability function maps the probability of the determined deviation of the mask surface from its target location after the first positioning of the mask and prior to the measurement of the same. For example, the probability function can be a Gaussian normal distribution and can be used during the ascertainment of the remaining deviation, i.e. the autofocusing of the mask.

As a result of using the value of the probability function for the metrological expectations for the respectively determined combination result, it is possible to conduct a plausibility check in addition to the preceding evaluation of the probability functions for the individual measured values, which can be considered to be a consistency check. The closer the measured value to the expected position, the higher the probability value assigned thereto, whereby significantly deviating measurements are advantageously included in the determination of the location with a lower weight.

To ascertain the overall probability for a combination result, the value of the probability function for the metrological expectations—optionally multiplied by a factor—can be added to the already available result in particular.

The combination result with the highest probability can then be selected as a measure for the location to be determined.

The location determined on the basis of the probability analysis thus ensures that the subsequently executed positioning of the mask surface is always or virtually always located within the region of the depth of focus required for a successful measurement of the structure, whereby incorrect measurements can be minimized or even entirely avoided, whereby for example the throughput of a mask inspection microscope can be increased.

When defining at least one probability function for the individual measured values in a further embodiment of the method, a standard deviation for the probability function can be specified by way of a sensitivity analysis. During the sensitivity analysis, for example one of the three probability functions can be displaced in the image of the measurement structure over a range of +/−100 pixels. In the process, the maximum overall probability of all combination results is ascertained continually and plotted against the pixels. In a second diagram, the location determined by way of the maximum overall probability, i.e. the combination result with the highest probability, is likewise plotted against pixels. As a result of displacing the one probability function over the entire region, the function of the determined location may contain at least two discontinuities, with a discontinuity occurring whenever the combination result with the maximum overall probability changes as a result of a switch from one combination result to a second combination result with a modified composition of the utilized measured values for the combination result. For example, the combination result with the maximum overall probability may initially be formed from the mean value of two measured values, with one of the two measured values being the measured value whose probability function is moved within the scope of the sensitivity analysis. Over the further course of the sensitivity analysis, the displacement may give rise to the case in which the overall probability of the displaced measured value is greater than that of the mean value, with the result that the measured value now defines the deviation rather than the mean value of the two measured values. This leads to the above-described discontinuity. Depending on the distance of the determined measured values and the width of the probability functions, more than two discontinuities might also occur in the region considered during the sensitivity analysis. In this case, the standard deviation can be adapted, whereby the width of the probability function is reduced, and the location of the discontinuities can be modified.

In particular, the standard deviation can be chosen such that the curve of the location ascertained during the sensitivity analysis on the basis of the probability analysis is continuous within a predetermined range. For example, this range can be +/−50 pixels. The adaptation of the standard deviation for determining the width of the probability function can be considered to be a weighting of the two probability functions used to determine the location, in which the influence of the metrological expectations has a greater weight during the determination of the location than the uncertainty of the measured value determination itself. The standard deviation can be zero in the limit case, i.e. based merely on the basis of the probability function of the metrological expectations for the purpose of determining the location by way of the probability analysis.

The method can find use within the scope of a measurement of a substrate for semiconductor lithography in particular. For example, this may relate to the measurement, the so-called registration, of a mask for a projection exposure apparatus, as already explained further above. The method can also be used for positioning wafers prior to the measurement or other surfaces which have stringent demands in respect of a positioning in their target location.

Other aspects, embodiments, and advantages follow.

DESCRIPTION OF DRAWINGS

The exemplary embodiments and variants are explained in detail below with reference to the drawing, in which.

DETAILED DESCRIPTION

Figure 1:
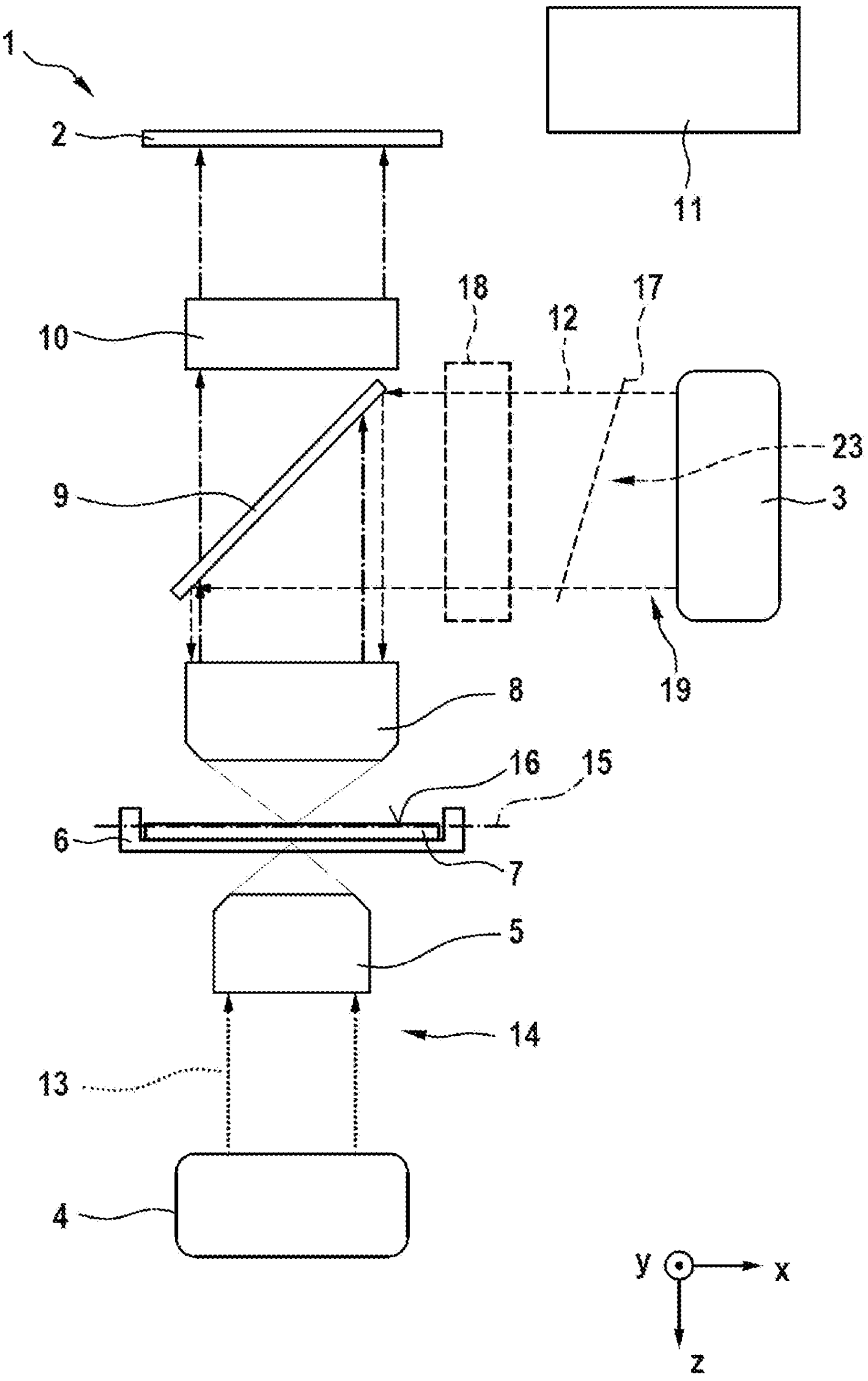
Fig. 1 Prior art
FIG. 1 shows a schematic illustration of a state-of-the-art mask inspection microscope which can be used to perform the method.

FIG. 1 shows a schematic illustration of a measuring device known from the prior art, which is designed as a mask inspection microscope 1 and serves to measure an object for semiconductor lithography in the form of a photomask or mask 7. The mask inspection microscope 1 comprises two light sources 3, 4, with a first light source 3 being designed to measure the mask 7 in reflection and a second light source 4 being designed to measure the mask 7 in transmission. The mask 7 is arranged on an object stage 6, which can position the mask 7 laterally (x-y-direction) and vertically (z-direction) in the sub-nanometre range. In this case, the positional accuracy can be in a range of better than 500 pm in particular, more particularly better than 250 pm.

During a measurement in transmission, the measurement light 13 of the illumination unit 14 comprising the light source 4 and an illumination optical element embodied as a condenser 5 passes through the condenser 5, which creates a desired light distribution on the mask 7. Then, the measurement light 13 passes through the mask 7, a magnifying imaging optical unit 8 and tube 10, and arrives at a recording device 2 in the form of a CCD camera in the example shown. The semi-transparent mirror 9 arranged between the imaging optical unit 8 and the tube 10 is used for the measurement in reflection and has no influence on the measurement in transmission.

During a measurement in reflection, the measurement light 12 emitted by the light source 3 is reflected at the semi-transparent mirror 9 and subsequently passes through the imaging optical unit 8, with the result that the mask surface 16 is illuminated. Then, like in the case of a measurement in transmission as well, the illuminated mask surface 16 is imaged in enlarged fashion on the recording device 2 by way of the imaging optical unit 8.

The recording device 2, the object stage 6, the imaging optical unit 8 and the light sources 3, 4 are connected to a controller 11 which controls the interplay of the individual components 2, 3, 4, 6, 8 using an open-loop or closed-loop mechanism and which is also designed to process the captured images.

The so-called focal plane 15 is also depicted in FIG. 1. The focal plane 15 is the place at which a flat object such as the mask surface 16, for example, must be positioned in order to be recorded in the recording device 2 with maximum sharpness. In the z-direction, the location of this focal plane 15 depends on the distance between the recording device 2 and the imaging optical unit 8, and on the optical properties of the imaging optical unit 8. Thus, its location is defined by the configuration of the mask inspection microscope 1. Despite being called focal plane, the focus of the imaging optical unit 8 is not situated in said focal plane. Using terminology from geometrical optics, the focal plane in fact is a plane at the object distance which is assigned to a fixed image distance (determined by the properties and configuration of the imaging optical unit 8 and the recording device 2).

Although the mask surface 16 is approximately in the region of the focal plane 15 in the embodiment depicted in FIG. 1, the deviation in the z-direction is so large that the image of the mask surface 16 captured by the recording device 2 is not sufficiently sharp to enable a subsequent image-based evaluation of the image for the purpose of determining the edges of the structures. Therefore, the location of the mask surface 16 needs to be optimized in such a way that, where possible, it is located in the focal plane 15 in the z-direction, i.e. so-called autofocusing needs to take place.

For the purpose of this autofocusing (see FIG. 2), i.e. the positioning of the mask surface 16 in the focal plane 15, an autofocus system 23 having a measurement structure 17 and an additional optical unit 18 is pivoted into the beam path 19 of the measurement light 12 in reflection measurement, between the light source 3 and the semi-transparent mirror 9. In this case, the additional optical unit 18 ensures that the central region of the measurement structure 17 is imaged sharply into the focal plane 15 by the imaging device 8. Thus, the beam direction in relation to the imaging device 8 is reversed in this case vis-à-vis the measurement operation of the mask inspection microscope 1; i.e. an image of the measurement structure 17 is created at the place where the mask surface 16 is situated during normal operation. The image plane of the image of the measurement structure 17 corresponds to the focal plane 15 of the image of the mask 7 on the recording device 2.

The measurement structure 17 is arranged at a tilt with respect to the beam path 19. Hence, the image of the measurement structure is also tilted in the region of the focal plane 15. In this case, the mask surface 16 serves as a projection surface for the measurement structure 17. If the central region of the measurement structure 17 is also imaged sharply in the centre of the mask surface 16, then the mask surface 16 is situated exactly in the focal plane 15, i.e. in the z-position that is optimal for a recording of the mask surface 16. Deviations in the lateral direction of the portions of the measurement structure 17 imaged sharply on the mask surface 16 are a measure for the deviation of the z-position of the mask surface 16 from the focal plane. The lateral offset of the sharply imaged portions vis-à-vis the central region of the mask surface 16 can in this case be converted directly into a deviation of the current z-position of the mask surface 16 from the focal plane 15.

Figure 2:
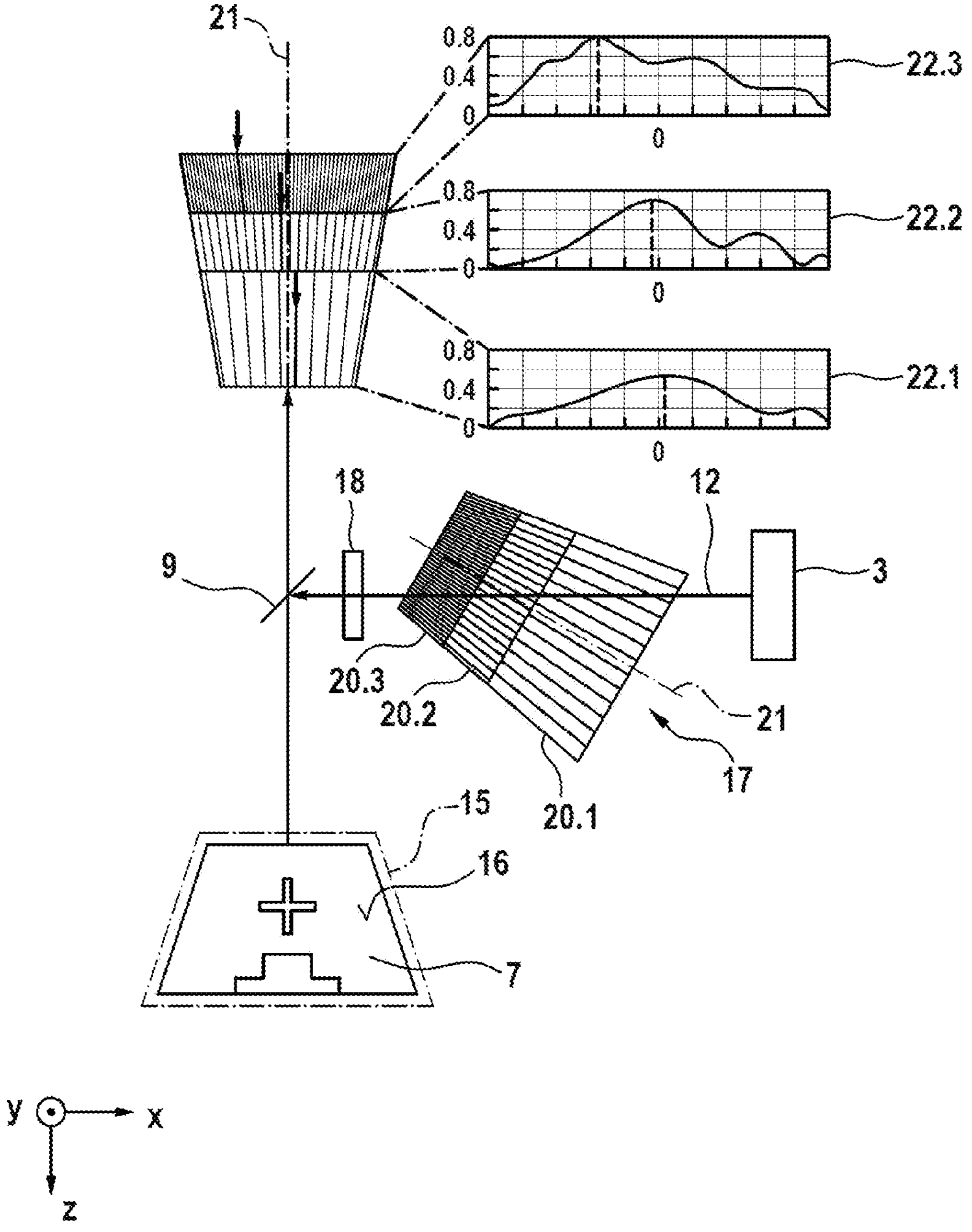
FIG. 2 shows a schematic illustration of an autofocus system of a mask inspection microscope.

To describe the autofocusing method, FIG. 2 shows a schematic illustration of an autofocus system 23.

As mentioned previously, the autofocusing ensures that the mask surface 16 is positioned in the optimal z-position prior to a measurement of the mask 7.

As already mentioned above, the mask inspection microscope 1 is calibrated prior to autofocusing, and the mask surface 16 is measured in relation to the coordinate system of the mask inspection microscope 1. This ensures that the mask surface 16 used as the projection surface for the measurement structure 17 is situated in the region of the tilted image of the measurement structure 17 prior to autofocusing.

As a result of the tilt of the measurement structure 17, one portion of the measurement structure 17 is always imaged sharply within a predetermined capture range of approximately +/−1 μm around the focal plane 15. As mentioned previously, the lateral offset of the sharply imaged portion from the centre line of the measurement structure 17 is a measure for the deviation of the mask surface 16 from the focal plane 15. In the example shown, the measurement structure 17 comprises a plurality of gratings 20.1, 20.2, 20.3 with different periodicities. The periodicities of the three gratings 20.1, 20.2, 20.3 in relation to the projection on the mask surface 16 are in the micrometre range. The different periodicities serve to avoid interferences with similar structures on the mask 7.

Additionally, the mask 7 is moved laterally in the x-direction, i.e. in the direction of the periodicities, while the measurement structure 17 which is projected onto the mask surface 16 is recorded, with the result that the structures of the mask 7 are blurred in the image, in contrast to the stationary projection of the measurement structure 17, whereby measurement errors can be minimized or at least significantly reduced.

To determine the deviation of the z-position of the mask surface 16 from the focal plane 15, the place of maximum image sharpness for the individual gratings 20.1, 20.2, 20.3 is determined for the gratings 20.1, 20.2, 20.3 from the contrast curves 22.1, 22.2, 22.3 which are depicted to the right of the image of the measurement structure 17 in FIG. 2. To elucidate matters, this portion depicted sharply in the image of the measurement structure 17 is marked in FIG. 2 by an arrow for each grating. The measured values formed as positions of the maximum image sharpness of the three gratings 20.1, 20.2, 20.3 typically deviate from one another on account of measurement inaccuracies.

Figure 3:
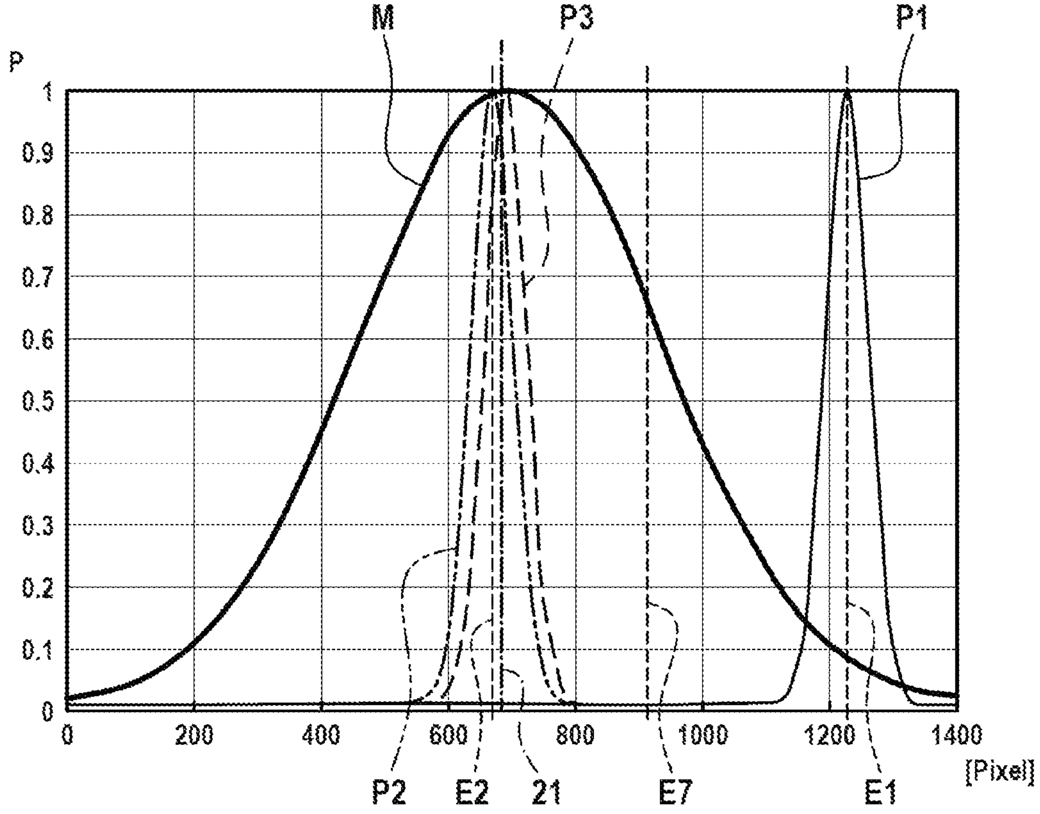
FIG. 3 shows a diagram explaining the determination of the location, and FIGS. 4A and 4B each show a diagram explaining the determination of the standard deviation for a probability function of individual measured values.

According to the present embodiment, the determination of the deviation of the z-position of the mask 7 from the determined lateral positions of the maximum image sharpness values of the three gratings 20.1, 20.2, 20.3 comprises a probability analysis which is described in detail on the basis of FIG. 3. As mentioned, the positional deviation of the location of the maximum image sharpness from the centre line 21 of the measurement structure 17, which is determined thus and in terms of pixels of the CCD camera, is a measure for the deviation in nm in the z-direction of the mask inspection microscope 1, with the number of pixels being converted into nm by way of a predetermined factor.

For explanatory purposes, FIG. 3 shows a diagram relating to the determination of the location of the mask surface 16 in relation to its target location determined by the focal plane 15, based on a probability analysis of the determined measured values (FIG. 2) and mean values determined therefrom. The horizontal axis plots the width of the image of the CCD camera in pixels and the vertical axis plots the probability. The thick and solid curve M depicted in FIG. 3 describes the probability function of the metrological expectations in the form of a Gaussian normal distribution. The latter is based on a multiplicity of measurements of a mask inspection microscope 1 and maps the expectation that the location of a region with maximum image sharpness is usually located in a range of +/−300 pixels around the centre line of the measurement structure 17, which is located at 700 pixels in the diagram and depicted by a thick dash-dotted line in FIG. 3. In particular, the probability function prevents two incorrect measurements located far outside the metrological expectation from being able to overrule the remaining third measurement which is probably correct. In this case, the standard deviation of the probability function is chosen such that the probability is greater than zero over the entire width of the image.

The three other curves P1, P2, P3 describe the probability functions of the three determined measured values, with the value of the determined measured values being located at the respective maximum of the associated probability function. These probability functions are intended to take into consideration the uncertainty of the measured values on account of measurement inaccuracies. In the example shown, the standard deviations of the probability functions of the determined measured values are identical and were determined on the basis of a sensitivity analysis explained in detail in FIGS. 4A and 4B. Initially, the three determined measured values are used to form combination results E1 to E7 and assess these on the basis of the probability analysis, with the most probable combination result being selected as the basis for the determination of the deviation of the mask surface 16 from the target location. In this case, E1 to E7 are pixel values on the abscissa of the diagram depicted in FIG. 3 in the example shown.

In a first step, seven possible combination results E1 to E7 are determined from the three determined measured values, as follows:

initially the three determined measured values themselves as individual values E1, E2, E3 (associated assumption: only one of the three determined values is correct within the scope of the measurement accuracy)

the mean values of in each case two of the three determined measured values as E4, E5, E6 (associated assumption: only two of the determined values are correct)

and the mean value of all three determined measured values as E7 (associated assumption: all determined values are correct).

On the basis of the diagram or mathematically, these combination results E1 to E7 present in pixels are considered as set forth below with regards to their probability $W_{GE}$ of being the correct result.

$$W_{GE1} = 0.5*M(E1) + 0.5*P1(E1)$$

$$W_{GE2} = 0.5*M(E2) + 0.5*P2(E2)$$

$$W_{GE3} = 0.5*M(E3) + 0.5*P3(E3)$$

$$W_{GE4} = 0.5*M(E4) + 0.5*SQRT\left((P1(E4))^2 + (P2(E4))^2\right)$$

$$W_{GE5} = 0.5*M(E5) + 0.5*SQRT\left((P1(E5))^2 + (P3(E5))^2\right)$$

$$W_{GE6} = 0.5*M(E6) + 0.5*SQRT\left((P2(E6))^2 + (P3(E6))^2\right)$$

$$W_{GE7} = 0.5*M(E7) + 0.5*SQRT\left((P1(E7))^2 + (P2(E7))^2 + (P3(E7))^2\right)$$

where

E1=determined measured value 1

E2=determined measured value 2

E3=determined measured value 3

E4=Mean value of determined measured values 1 and 2

E5=Mean value of determined measured values 1 and 3

E6=Mean value of determined measured values 2 and 3

E7=Mean value of determined measured values 1, 2 and 3

M(E)=Probability function M of metrological expectation

P1(E)=Probability function P1 of determined measured value 1

P2(E)=Probability function P2 of determined measured value 2

P3(E)=Probability function P3 of determined measured value 3.

By way of example, the overall probability $W_{GE7}$ should initially be estimated purely qualitatively for the case shown in FIG. 3. As depicted in the diagram (dashed line), a value of approximately 900 pixels arises for the mean value E7—i.e. for the assumption that all three measurements are correct. However, all three probability functions P1, P2, P3 have a value close to zero there, with the result that the square root term in the aforementioned formula for $W_{GE7}$ likewise only supplies a contribution of close to zero to the overall probability. The contribution of the function M of metrological expectation at 900 pixels is approx. 0.65, and so an overall probability of the order of approx. 0.4 will probably arise as a result.

The situation is different for the assumption that P2 and P3 represent correct measurements. A value of approx. 690 pixels is assumed as mean value E6 (not depicted here). This yields a value of the order of 1.4 for the square root term in $W_{GE6}$. M(E6) is of the order of 1, and so a value of the order of 1.2 will probably arise for the overall probability, and so the value E6 is far more probably correct than the value E7.

The calculation has not been normalized, and so values greater than 1 may arise by all means for the overall probabilities $W_{GEx}$ 1.

Figure 4A:
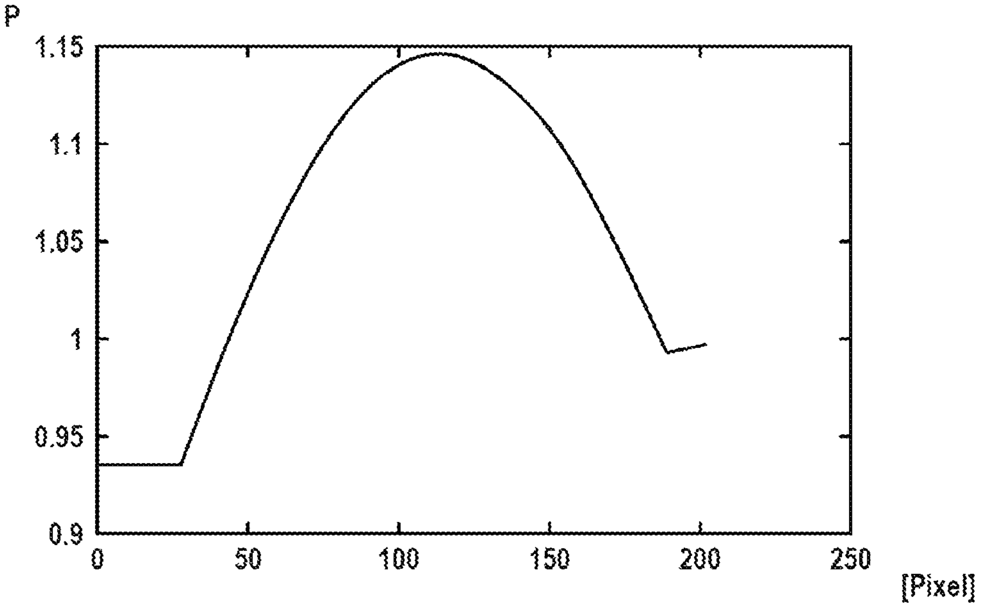
Figure 4B:
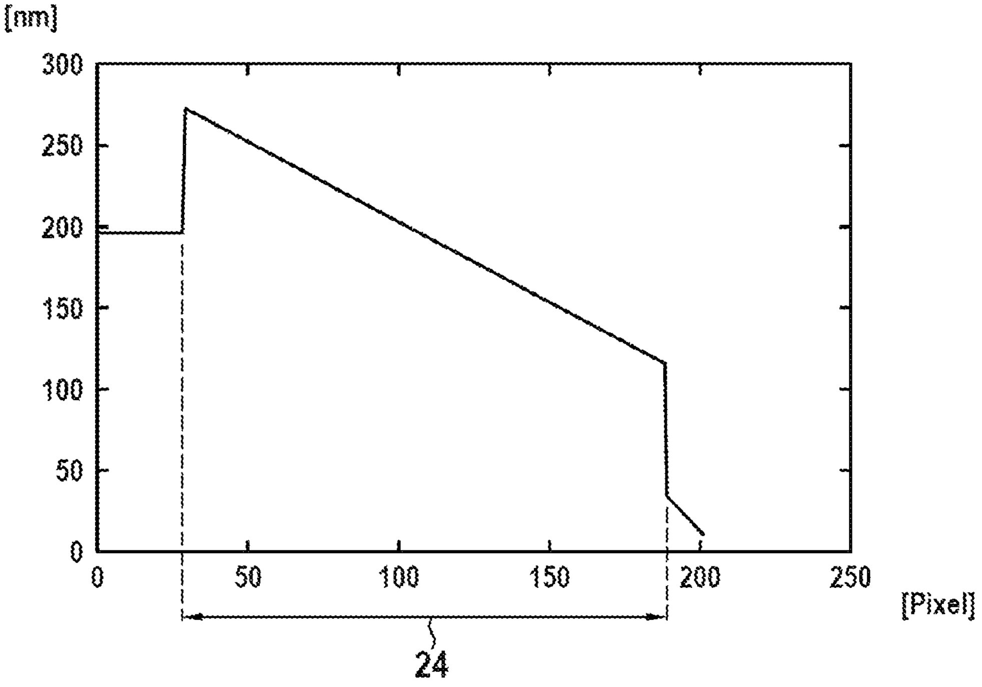

FIG. 4A and FIG. 4B each show a diagram for explaining the determination of the optimal standard deviation of the probability functions of the determined measured values by way of a sensitivity analysis. The criterion for the choice of standard deviation is that the function of the location determined by way of the probability analysis is continuous within a region that is as broad as possible, depending on an offset of the probability functions around the x-axis (i.e. when displacing the respective probability function by a certain number of pixels or nanometres).

FIG. 4A shows the curve of the maximum overall probability (vertical axis) for the most probable combination result during the sensitivity analysis. The probability function P2 in FIG. 3 is moved by +/−100 pixels (horizontal axis) during the sensitivity analysis. The overall probability $W_G$ has not been normalized in the embodiment depicted in FIG. 4A, and so values greater than 1 are also possible.

FIG. 4B shows the value (vertical axis) of the most probable combination result for the deviation during the sensitivity analysis. Once again, the horizontal axis shows the movement of the probability function P2 through +/−100 pixels. A discontinuity in the curve indicates a change of the combination result E1-E7 as most probable result. Advantageously, the standard deviation is chosen such that there is no discontinuity in the value of the most probable combination result, i.e. the used location, in the relevant range of the autofocus measurement, which is typically +/−50 pixels. This criterion is satisfied in the case depicted in FIG. 4B, in which the continuous range 24 of the deviation is almost +/−75 pixels.

Digital Implementations

The features of the controller can be implemented, at least in part, in digital electronic circuitry, or in computer hardware, firmware, or in combinations of these. For example, the features can be implemented in a computer program product tangibly embodied in an information carrier, e.g., in a machine-readable storage device, for execution by a programmable processor; and features can be performed by a programmable processor executing a program of instructions to perform functions of the described implementations by operating on input data and generating output. The described features can be implemented in one or more computer programs that are executable on a programmable system including at least one programmable processor, such as multiple processors, coupled to receive data and instructions from, and to transmit data and instructions to, a data storage system, at least one input device, and at least one output device. A computer program includes a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors one of multiple processors of any kind of computer. Generally, a processor will receive instructions and data from a read-only memory or a random access memory or both. Computers include a processor for executing instructions and one or more memories for storing instructions and data. Generally, a computer will also include, or be operatively coupled to communicate with, one or more mass storage devices for storing data files; such devices include magnetic disks, such as internal hard disks and removable disks; solid-state disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits). The features can implemented in a single process or distributed among multiple processors at one or many locations. For example, the features can employ cloud technology for data transfer, storage, and/or analysis.

Additional embodiments are within the scope of the following claims.

LIST OF REFERENCE SIGNS

1 Mask inspection microscope
2 Recording device, CCD camera
3 Light source for reflection
4 Light source for transmitted light
5 Condenser
6 Object stage
7 Mask
8 Imaging optical unit
9 Semi-transparent mirror
10 Tube
11 Controller
12 Measurement light in reflection
13 Measurement light in transmission
14 Illumination unit
15 Focal plane
16 Mask surface
17 Measurement structure
18 Autofocus system optics
19 Beam path of reflection
20.1-20.3 Grating
21 Measurement structure centre line
22.1, 22.2, 22.3 Contrast curve
23 Autofocus system
24 Continuous range of location
P1 Probability function for grating 1
P2 Probability function for grating 2
P3 Probability function for grating 3
M Probability function for metrological expectations
E1 Result combination 1
E2 Result combination 2
E3 Result combination 3
E4 Result combination 4
E5 Result combination 5
E6 Result combination 6
E7 Result combination 7

What is claimed is:

1. A method for determining a location of an object surface in relation to a target location in a measuring device for semiconductor technology, the location being determined on the basis of at least two measured values which represent the location, characterized in that the determination of the location comprises a probability analysis, wherein the probability analysis defines a probability function for each of the measured values to account for measurement inaccuracies.

2. The method of claim 1, characterized in that the target location is the location of a focal plane of the measuring device.

3. The method of claim 2, characterized in that for sub-combinations of at least three measured values, a mean value of the respective sub-combination is determined in each case as a combination result.

4. The method of claim 3, characterized in that the probability functions are defined for the at least three measured values, and a probability ($W_{GEx}$) is determined in each case for possible combination results of the three measured values.

5. The method of claim 4, characterized in that to determine the probability ($W_{GEx}$), the values of the probability functions for the respective combination result are added.

6. The method of claim 5, characterized in that to determine the probability, the value of a probability function for metrological expectations of the measuring device is added to the combination result determined in each case.

7. The method of claim 1, characterized in that for sub-combinations of at least three measured values, a mean value of the respective sub-combination is determined in each case as a combination result.

8. The method of claim 7, characterized in that a probability ($W_{GEx}$) is determined in each case for possible combination results of the three measured values.

9. The method of claim 8, characterized in that to determine the probability ($W_{GEx}$), the values of the probability functions for the respective combination result are added.

10. The method of claim 8, characterized in that the probability analysis further includes a probability function for metrological expectations for the measuring device.

11. The method of claim 10, characterized in that the value of the probability function for the metrological expectations is used for the combination result determined in each case.

12. The method of claim 11, characterized in that to determine the probability, the value of the probability function for the metrological expectations is added to the combination result determined in each case.

13. The method of claim 12, wherein the method is implemented electronically.

14. The method of claim 11, wherein the method is implemented electronically.

15. The method of claim 7, characterized in that the combination result with the highest probability is selected as a measure for the location to be determined.

16. The method of claim 8, characterized in that when defining at least one of the probability functions, a standard deviation for the probability function is specified by way of a sensitivity analysis.

17. The method of claim 16, characterized in that the standard deviation is chosen such that the value of the most probable location ascertained during the sensitivity analysis on the basis of the probability analysis is continuous within a predetermined range.

18. The method of claim 1, wherein the object surface is a surface of a photolithography mask.

19. The method of claim 6, wherein the method is implemented electronically.

20. The method of claim 1, wherein the method is implemented electronically.

21. The method of claim 1, wherein the target location corresponds to a z-location of a focal plane of a mask inspection microscope and each measured value corresponds to a location of maximum image sharpness on a camera of a tilted measurement structure projected onto the camera by the measuring device.

22. The method of claim 21, wherein each measurement structure is a grating having a different period.

* * * * *